United States Patent
Wada et al.

[11] Patent Number: 5,975,913
[45] Date of Patent: Nov. 2, 1999

[54] MULTILAYER INTERCONNECTION BOARD AND CONNECTION PIN

[75] Inventors: Shigehito Wada; Hisashi Saitou; Kazutoshi Morishima, all of Tokyo, Japan

[73] Assignee: Oki Electric Industry Co., Ltd., Tokyo, Japan

[21] Appl. No.: 09/050,889

[22] Filed: Mar. 31, 1998

[30] Foreign Application Priority Data

Aug. 29, 1997 [JP] Japan .................................. 9-233713

[51] Int. Cl.$^6$ .................................................. H01R 29/00
[52] U.S. Cl. .................................. 439/45; 439/46; 439/48
[58] Field of Search ........................... 439/45, 46, 47, 439/48

[56] References Cited

U.S. PATENT DOCUMENTS

| | | | |
|---|---|---|---|
| 3,147,555 | 9/1964 | Dufendach et al. | |
| 3,151,923 | 10/1964 | Etal | 439/48 |
| 3,349,361 | 10/1967 | Cartelli | 439/48 |
| 3,350,676 | 10/1967 | McFadden | 439/48 |
| 4,002,245 | 1/1977 | Mink | 214/1 BD |
| 4,463,235 | 7/1984 | Gentric et al. | |
| 4,778,393 | 10/1988 | Hosogai et al. | 439/45 |
| 5,613,858 | 3/1997 | Estes et al. | |
| 5,790,651 | 8/1998 | Suzuki et al. | 439/45 |

FOREIGN PATENT DOCUMENTS

| | | |
|---|---|---|
| 0 768 802A1 | 4/1997 | European Pat. Off. . |
| 1 727 662 | 8/1956 | Germany . |

OTHER PUBLICATIONS

"Automated MDF System for Switching System", Akira Fukuoka et al., Fujitsu Scientific & Technical Journal, vol. 28 No. 3 (1992); pp. 422–438.

*Primary Examiner*—Renee S. Luebke
*Assistant Examiner*—Hae Moon Hyeon
*Attorney, Agent, or Firm*—Rabin & Champagne, PC

[57] ABSTRACT

The interconnection board includes a plurality of non-conductive insulation layers and through-holes running through the insulation layers. A plurality of conductive patterns are provided on each insulation layer, electrically insulated from each other, and exposed to the inside of one through-hole at the same axial position of the through-hole. The connection pin has a non-conductive stem and a connection pattern provided on the non-conductive stem. The connection pattern extends in the axial direction of the connection pin and electrically connects two conductive patterns provided on different insulation layers at the same circumferential position in the through-hole, by bringing the conductive patterns into contact at positions which are axially different and circumferentially the same.

27 Claims, 9 Drawing Sheets

MULTILAYER INTERCONNECTION BOARD AND CONNECTION PIN

The present invention claims priority based on a Japanese patent application, H09-233713 filed on Aug. 29, 1997, the contents of which are incorporated herein by reference.

BACKGROUND OF THE INVENTION

1. Field of Invention

The present invention relates generally to an interconnection board and a connection pin for connecting a user line of a communication system to a communication network, and to a main distribution frame (MDF) having the above interconnection board and connection pin. In particular, the present invention rotates to a multilayer interconnection board and a connection pin, which allow electrically conductive patterns (referred to simply as conductive patterns in this specification) provided on the insulation layers to be electrically connected along desired routes.

Further, the present invention relates to an MDF, which connects user lines to a service node such as an exchange unit in a public communication system by means of the multilayer interconnection board and the connection pin, and to an end exchange station in which the MDF is provided.

2. Description of Related Art

Conventionally, user lines in a telephone communication system are connected to a multilayer interconnection board, and then to a service node such as an exchange unit by a connection pin. Conductive patterns are provided on each insulation layer of the multilayer interconnection board. One conductive pattern on ore insulation layer is connected to another conductive pattern provided on another insulation layer by a connection pin.

Figure 1:
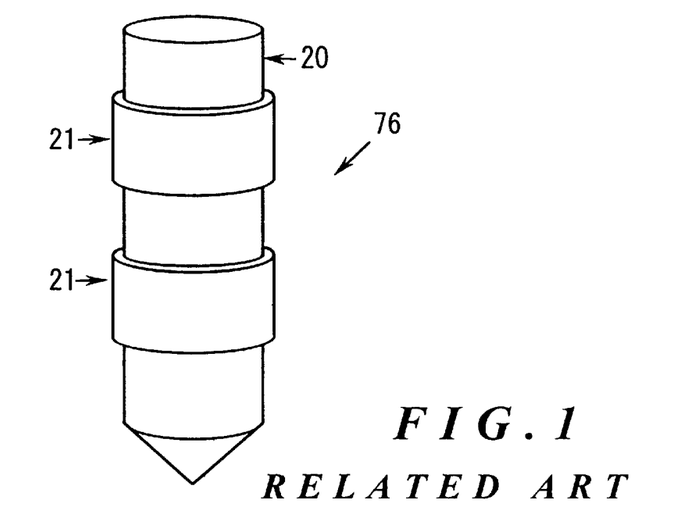
FIG. 1 shows a conventional connection pin.

FIG. 1 shows a connection pin 76 of the prior art. The connection pin 76 has a non-conductive stem 20 and annular connection patterns 21 provided on the non-conductive stem 20.

Figure 2:
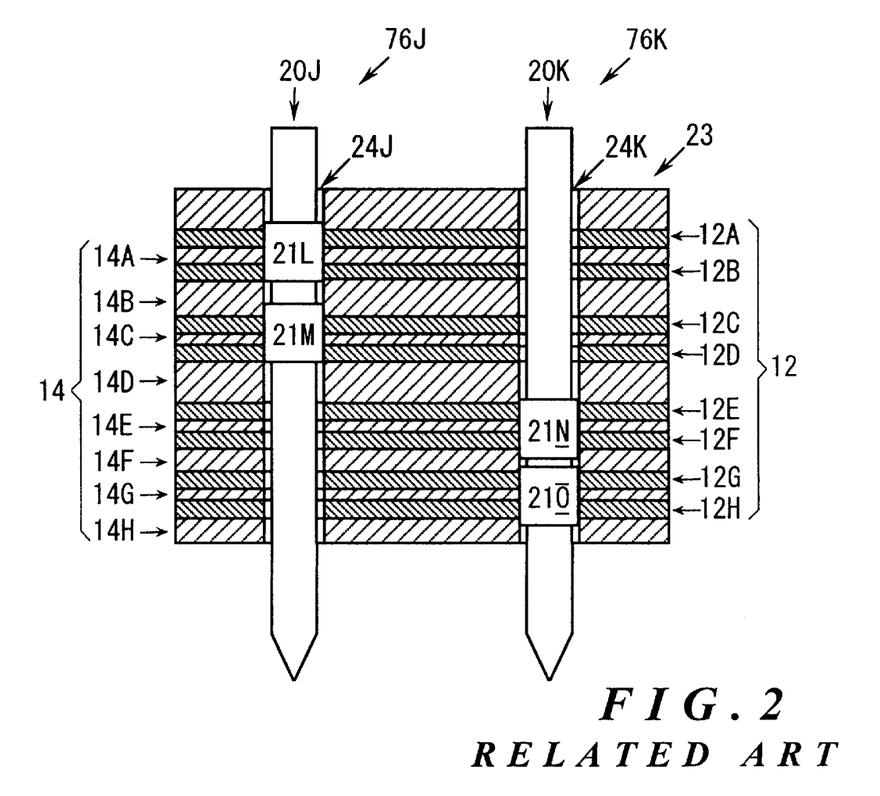
FIG. 2 shows connections between pins and a multilayer interconnection board according to the prior art.

FIG. 2 shows a multilayer interconnection board 23 and the connection pins 76J and 76K (generally referred to as 76) therein of the conventional art. A connection pin 76 connects two of the conductive patterns 12A through 12H (generally referred to as 12) of the multilayer interconnection board 23, when inserted into a through-hole 24 extending through the multilayer interconnection board 23.

In FIG. 2, the multilayer interconnection board 23 includes insulation layers 14A through 14H (generally referred to as 14), which are substantially non-conductive, and conductive patterns 12A through 12H (generally referred to as 12) provided on the insulation layers 14A through 14H, respectively. A conductive pattern 12 on one insulation layer 14 is electrically insulated from that on other insulation layers. The conductive patterns 12 are exposed at the inner walls of the through-holes 24.

When a connection pin 76 is inserted into a through-hole 24J or 24K (generally referred to as 24) provided in the multilayer interconnection board 23, the conductive patterns 12 on different insulation layers are electrically connected to each other by the connection patterns 21 of the connection pin 16. As stems 20J and 20K are non-conductive and connection patterns 21L through 21O are conductive, electrical connections are made on each of routes 12A-21L-12B, 12C-21M-12D, 12E-21N-12F and 12G-21O-12H.

Figure 3:
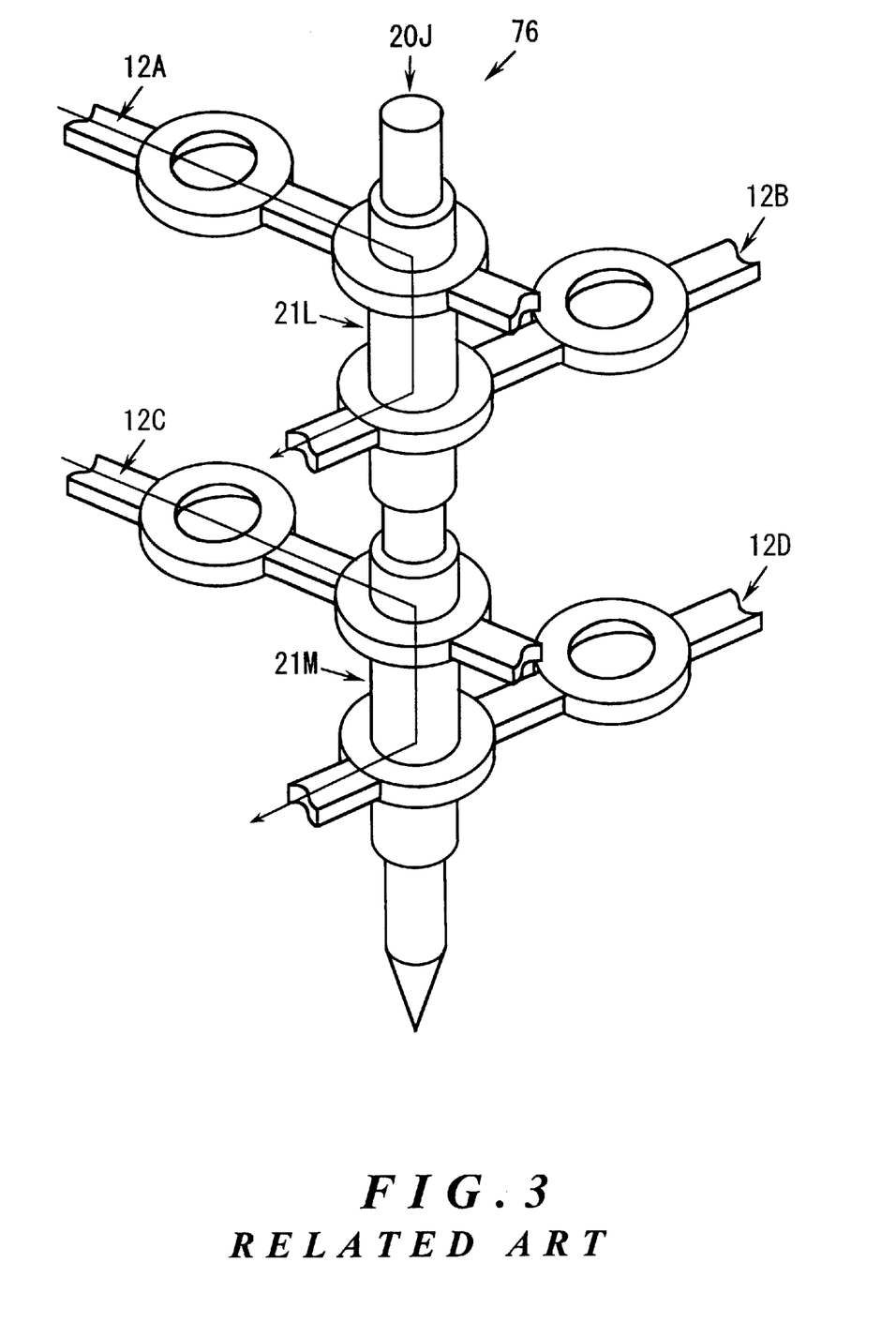
FIG. 3 shows a connection between the connection pin and the multilayer interconnection board according to the prior art.

FIG. 3 shows the electrical routes 12A-21L-12B and 12C-21M-12D shown in FIG. 2, in detail. The conductive patterns 12A and 12B are connected by the connection pattern 21L and the conductive patterns 12C and 12D are connected by the connection pattern 21M. The connection patterns 21L and 21M are electrically insulated from each other.

A conventional connection pin 76 makes only one electrical path between conductive patterns 12 on two different insulation layers. For example, in FIGS. 2 and 3, only one electrical path is made between the conductive patterns 12A and 12B and one other electrical path is made between the conductive patterns 12C and 12D. The conductive patterns 12B and 12C are electrically insulated from each other.

To obtain enough electrical paths in a small volume by the above-mentioned structure, the multilayer interconnection board needs to include eight to ten layers, the production and operation of which require very high precision.

SUMMARY OF THE INVENTION

Therefore, it is an object of the present invention to provide a multilayer interconnection board, which provides a high density of electrical paths in a small volume without requiring excessive precision in the production, a connection pin for such a multilayer interconnection board, and an MDF which allows such a connection pin to be inserted into the multilayer interconnection board in a desired orientation.

According to one aspect of the present invention, the interconnection board includes a plurality of non-conductive insulation layers and through-holes running through the insulation layers. A plurality of conductive patterns are provided on each insulation layer, which are electrically insulated from each other and are exposed on the inside surface of one through-hole at the same axial position of the through-hole.

The connection pin to be inserted in the through-hole has a non-conductive stem and a connection pattern provided on the non-conductive stem for electrically connecting two conductive patterns that are exposed to the inside of the through-hole on different insulation layers. The connection pin may have a plurality of the connection patterns at each of different axial positions of the connection pin.

The connection pattern extends in the axial direction of the connection pin and electrically connects two conductive patterns provided on different insulation layers at the same circumferential position in the through-hole, by bringing the conductive patterns into contact at positions which are axially different and circumferentially the same. Alternatively, one of the connection patterns may extend in both the axial and the circumferential directions of the pin so as to connect the two conductive patterns provided at different circumferential positions on different layers in the through-hole.

The connection pin further includes a pinhead. A first pair of protrusions protruding in a radial opposite directions of the pin and facing each other is connected to the upper portion of the pinhead. A second pair of protrusions protruding in the radial direction of the pin and facing each other is provided in the same circumferential orientation as the first pair and is connected to the lower portion of the pinhead.

The MDF for connecting a user line to a desired service node includes a matrix board having a plurality of multilayer interconnection boards, a user side connected to the user line and a service-node side connected to the service node. A robot has a pair of arms facing each other, each arm having first and second cavities aligned along the axial direction of the connection pin.

The first and second cavities are formed so as to match one protrusion connected to the upper portion of the pinhead and one protrusion connected to the lower portion of the pinhead, respectively, so that the arm will grasp the pin in the desired orientation. Each protrusion of the pin has a v-shape including an edge aligned in an axial direction of the pin and each cavity of the arm has a v-shape corresponding to the v-shape of the protrusion. A robot control unit controls the robot to grasp the pin with its arms and to insert the pin into one of the through-holes in the desired orientation so as to connect the user side to the service-node side along the desired route.

DETAILED DESCRIPTION OF THE INVENTION

Preferred embodiments of the present invention will be described with reference to the attached drawings.

1. First Embodiment

Figure 4:
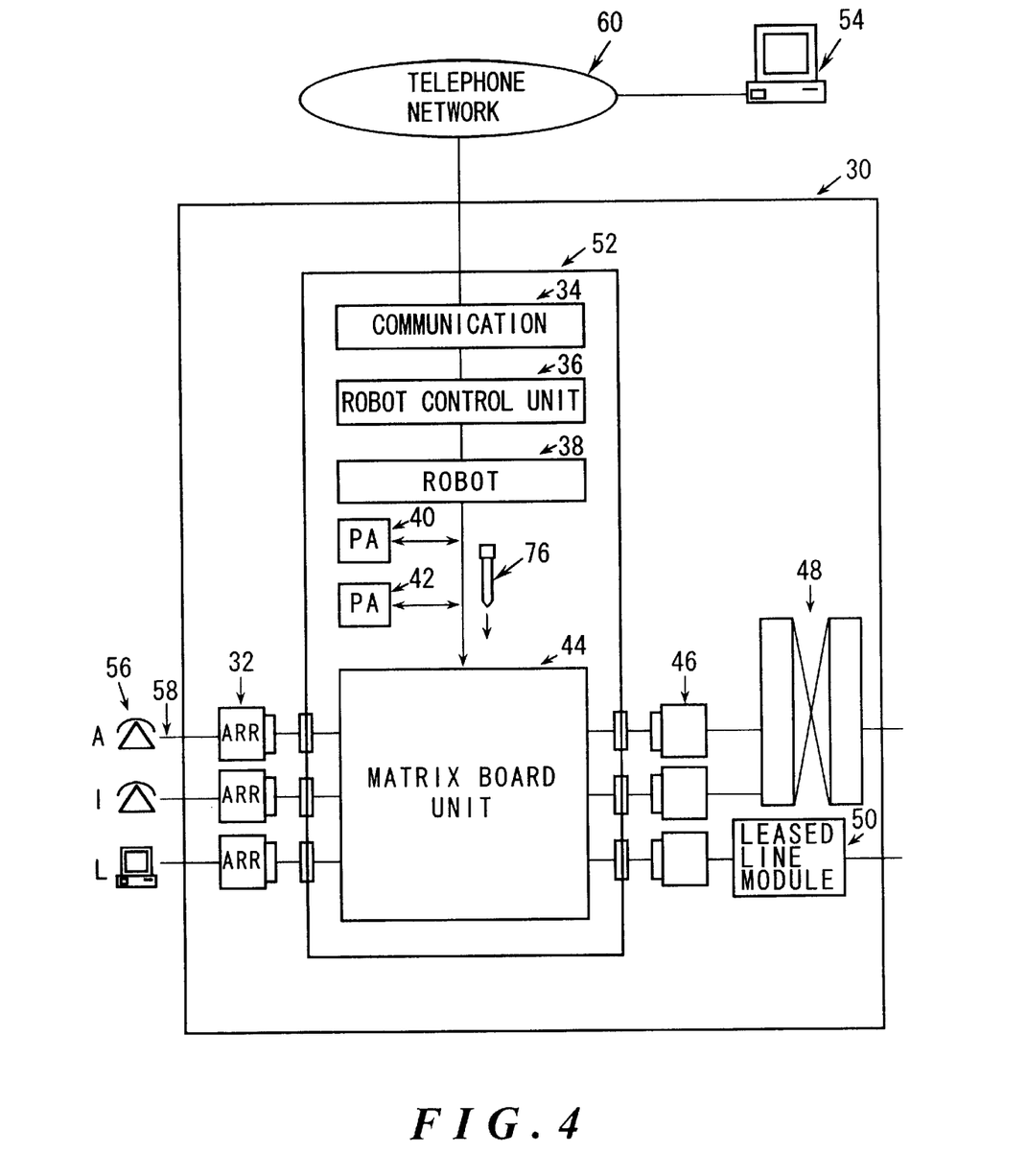
FIG. 4 shows an arrangement of an end exchange station using a multilayer interconnection board.

FIG. 4 shows an arrangement of an end exchange station 30 of the present invention in a telephone communication system. The end exchange station 30 includes lightning arresters 32, a main distribution frame (referred to as an MDF) 52, service node terminals 46, an exchange unit 48 and a leased line module 50. Communication equipment 56 of users is connected to the MDF 52 via user lines 58 and lightning arresters 32. The MDF 52 connects the user lines 58 with service nodes such as an exchange unit 48 and a leased line module 50, depending on the types of communication services required by the users. The MDF 52 is controlled by an operating terminal 54 via a telephone network 60.

The MDF 52 includes a matrix board unit 44, pin arrays 40 and 42 and a robot 38 for moving the connection pins 76 with its arms. The MDF 52 further includes a robot control unit 36 for controlling the robot 38, and a communication unit 34 which receives information required for controlling the robot control unit 36 from the operating terminal 54. In pin arrays 40 and 42, connection pins 76 to be inserted into the matrix board unit 44 are arranged.

The type of the connection pins 76 arranged in the pin array 40 is different from that of the connection pins 76 arranged in the pin array 42. The robot control unit 36 selects appropriate connection pins 76, which can connect the user line 58 to a desired service node, from one of the pin arrays 40 or 42 based on a command received from the operating terminal 54, and then controls the robot 38 so as to insert the selected connection pins 76 into the appropriate position in the matrix board unit 44.

Figure 5:
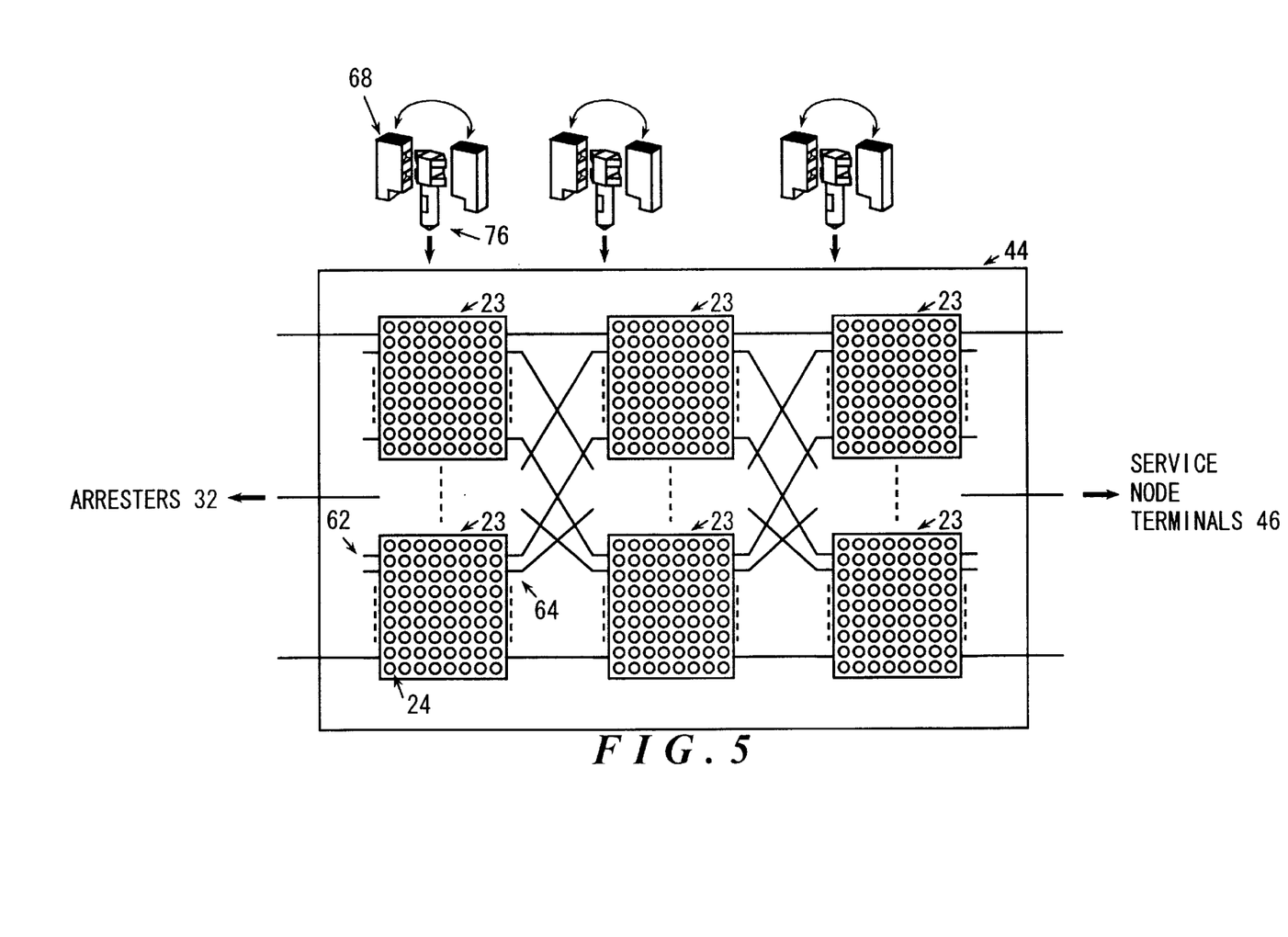
FIG. 5 shows a configuration of the matrix board unit 44 in FIG 4.

FIG. 5 shows the matrix board unit 44 shown in FIG. 4 in detail. The matrix board unit 44 includes a plurality of multilayer interconnection boards 23 arranged in a matrix. The multilayer interconnection boards 23 in one column of the matrix board unit 44 are connected to the multilayer interconnection boards 23 arranged in the next column. Each multilayer interconnection board 23 has a number of user-side terminals 62 closer to the arresters 32, service side terminals 64 closer to the service node terminals 46, and through holes 24 arranged in a matrix.

The connection pins 76 are inserted into desired through-holes 24 after being rotated by the arms 68 of the robot 38 to the prescribed orientation. Each user line 58 is connected to one user side terminal 62 of the multilayer connection board 23 via a lightning arrester 32. Each user side terminal 62 of the multilayer interconnection board 23 is connected to a desired service side terminal 64 depending on the positions, orientations and types of the connection pins 76 inserted into the desired through-holes 24. The service side terminals 64 are further connected to the user side terminals 62 of the multilayer connection boards 23 arranged in the next column.

Figure 6:
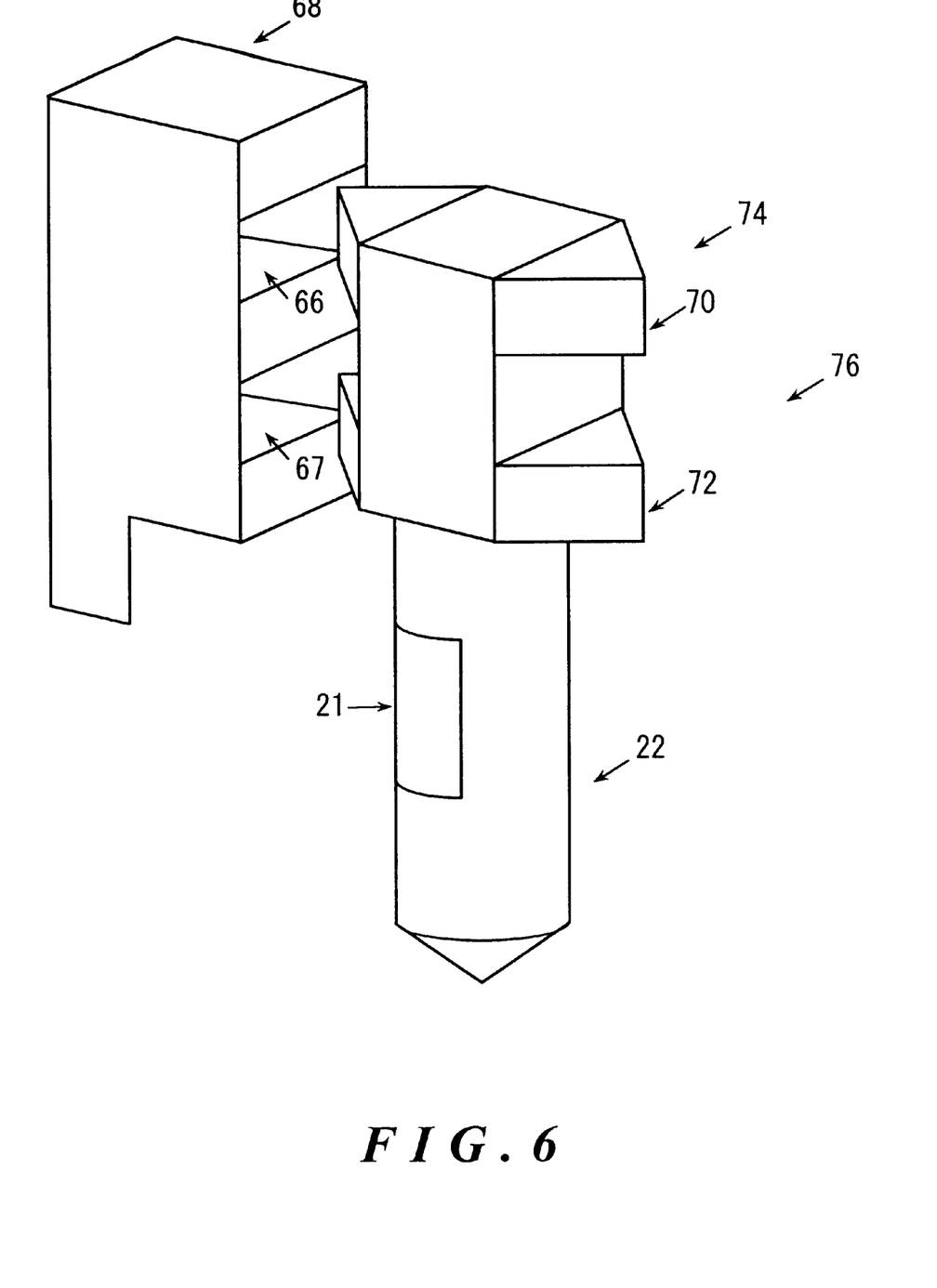
FIG. 6 shows a configuration of the connection pin 76 in FIG. 5.

FIG. 6 shows a connection pin 16 and arm 68 shown in FIG. 5, in detail. Two arms 68 of the robot 38 facing each other grasp the pin 76 from opposite directions, though only one arm 68 is shown in FIG. 6 for simplicity. The connection pin 76 includes a connection pin body 22 and a pinhead 74, which is radially larger than the pin body 22. A connection pattern 21 for electrically connecting two conductive patterns 12 of the multilayer interconnection board 23 is provided on a limited portion of the outer surface of the connection pin body 22 partially extending around the entire circumference of the pin body 22.

On each of two opposite sides of the pinhead 74, V-shaped protrusions 70 and 12 are provided at the upper and lower portions thereof, respectively, so as to be opposed to each other. On the other hand, V-shaped cavities 66 and 67 are provided in the arms 68 so as to be aligned with the V-shaped protrusions 70 and 72. Therefore, even if the orientation of the connection pin 76 in the pin array 40 or 42 deviates from the correct orientation, the deviation can be corrected when the arms 68 of the robot 38 grasp the pinhead 74. As an alternative, the protrusions and cavities may have a curved shape. The number of protrusions and cavities may be varied, and even only one or two of each may be provided. It is however, preferable to have more than one protrusion and cavity in order to correct the inclination of the connection pin body 22 when the arm 68 grasps the connection pin 76.

The robot control unit 36 makes the arm grasp the connection pin 76, rotate the connection pin 76 to the desired orientation, and then insert the connection pin into the desired through-hole 24. Alternately, all of the connection pins 76 in the same pin array may have the same circumferential orientation and all the connection pins 76 in another pin array may have a different circumferential orientation. In this case, the same effects as those obtained when the connection pins 76 are inserted after the arm 68 is rotated can be obtained by selecting connection pins 76 with the appropriately positioned connection patterns 21 to be inserted into the through-holes.

Figure 7A:
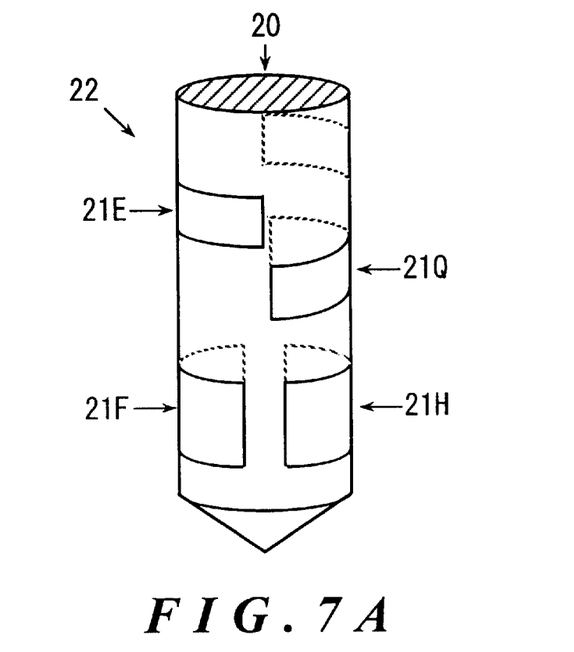
FIGS. 7A an 7B show a connection pin body 22 of the first embodiment of the present invention.
Figure 7B:
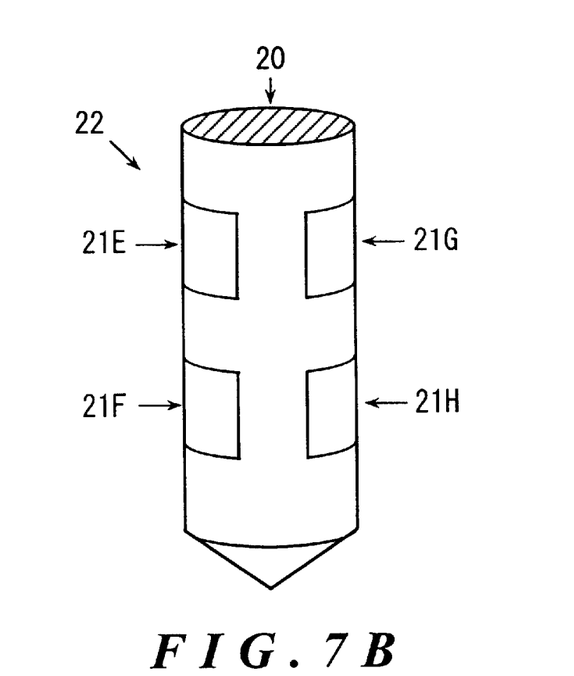

FIGS. 7A and 7B illustrate two examples of pin body 22 shown in FIG. 6, in detail. A stem 20 is made of non-conductive material. The connection patterns 21E, 21F, 21Q, 21G and 21H (generally referred to as 21) are arranged on the stem 20. The connection pattern 21 electrically connects two conductive patterns that are exposed to the inside of the through-hole 24 on different insulation layers.

The connection pin body 22 has a plurality of the connection patterns 21 at the same axial positions of the connection pin body 22. Each of the connection patterns 21 is a surface area comprising a portion of an annulus around the stem 20. Therefore, each of the connection patterns 21 extends around only a limited portion of the circumference, which portions correspond to the conductive patterns 12 of the multilayer interconnection board 23.

Figure 8:
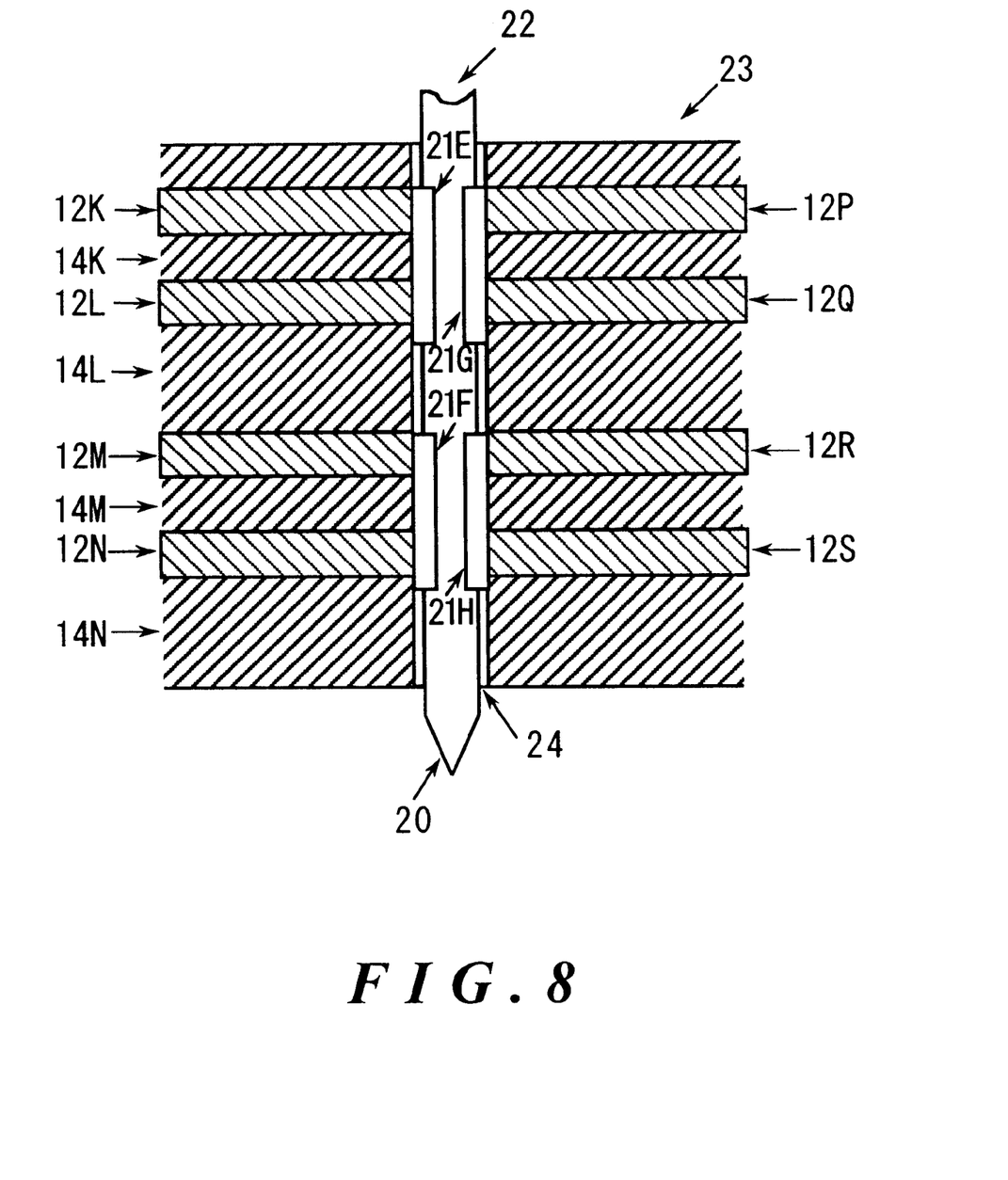
FIG. 8 shows the state in which a connection pin is inserted into the multilayer connection board, according to the first embodiment of the present invention.

FIG. 8 shows the electrical connections between the conductive patterns 12 of the multilayer interconnection board 23 and the connection patterns 21 of the connection pin body 22. A plurality of conductive patterns 12, electrically insulated from each other, are provided on each insulation layer 14 and extend to the inner wall of any given through-hole 24 at substantially the same axial position of the through-hole 24.

The conductive patterns 12 have the same width at the same axial position of the through-hole 24. The circumferential pitch and circumferential interval between any pair of the plurality of conductive patterns 12 in the through-hole 24 is the same. The connection patterns 21 provided at the same axial position of the connection pin 76 have the same circumferential width. The circumferential pitch and circumferential interval between any pair of connection patterns 21 provided at the same axial position of the connection pin 76 is also the same. A plurality of connection patterns 21 may be provided at axially different and circumferentially same positions of the connection pin body 22.

The connection pattern 21 extends in the axial direction of the connection pin 76 and electrically connects two conductive patterns 12 provided on different insulation layers 14 at the same circumferential position in the through-hole 24, by bringing the conductive patterns 12 into contact at positions which are axially different and circumferentially the same. Since the conductive patterns 12 do not extend to other layers via the through-hole 24, the conductive patterns on a given insulation layer are also electrically insulated from those on different insulation layers and can be electrically connected to each other by the connection patterns 21 of the connection pin body 22.

The conductive patterns 12 are exposed on the inside surface of the through-hole 24 only along a limited portion of the circumferential distance. Since the connection patterns 21 are also provided along limited portions of the circumference on the stem 20, the connections actually made at the through-hole 24 will vary depending on the orientation with which the connection pin body 22 is inserted into the through-hole 24. The appropriate circumferential orientation for achieving the desired connection is previously calculated by the robot control unit 36 (FIG. 4) and the robot 38 rotates the pin 76 with the arms 68 (FIG. 5) to the appropriate orientation calculated by the robot control unit 36 before inserting the connection pin 76 into the through-hole 24.

By configuring the conductive patterns and insulation layers in such a manner, a number of conductive patterns 12 provided on two different insulation layers can be connected to each other. For example, where two conductive patterns 12 are exposed on the same through-hole 24 on each insulation layer, twice the number of conductive patterns 12 can be interconnected in the same amount of space as can be in the prior art. The conductive patterns 12 exposed on the inner wall of the through-hole 24 are electrically connected by the connection patterns 21 of the connection pin body 22.

In FIG. 8, the connection pin body 22 shown in FIG. 7A is inserted into the through-hole 24 of the multilayer interconnection board 23. The corresponding conductive patterns 12 are connected to each other by the connection patterns 21E–21H and electrical connection is established along each of the four routes (1) 12K-21F-12L, (2) 12M-21F-12N, (3) 12P-21G-12Q and (4) 12K-21H-12S. The stem 20 of the connection pin body 22 is non-conductive, and no conduction is established between the routes (1), (2), (3) and (4).

Figure 9:
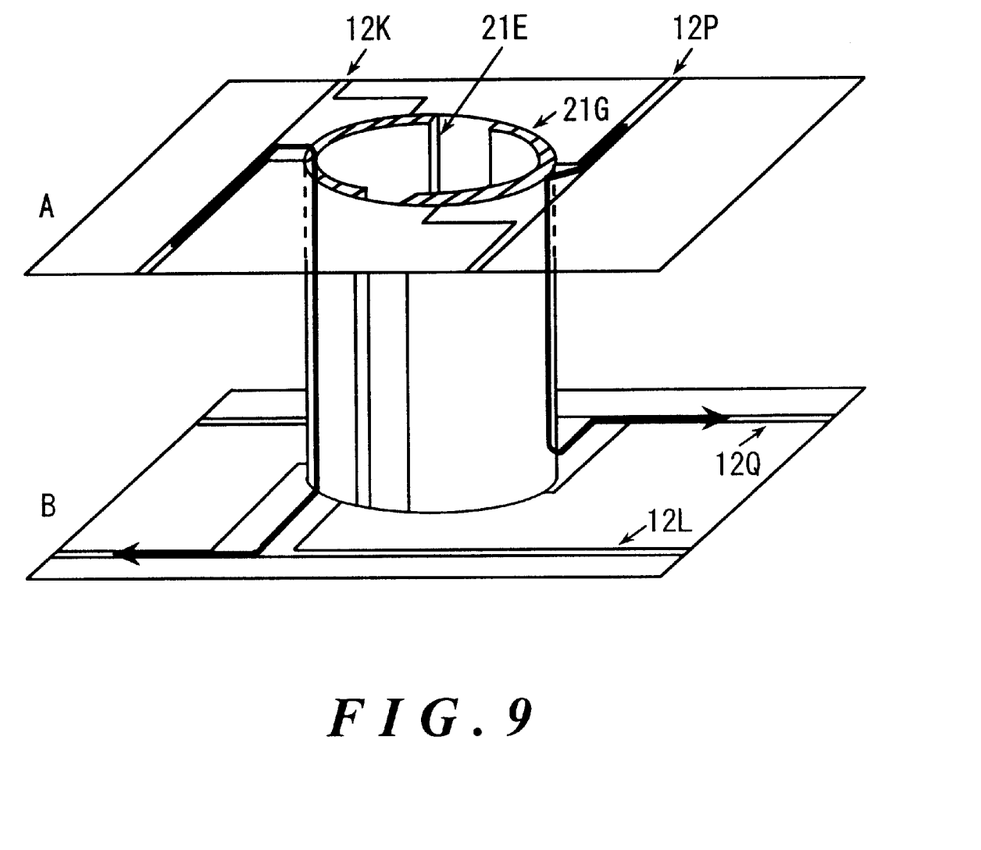
FIG. 9 shows a connection between conductive patterns according to the first embodiment of the present invention.

FIG. 9 shows the electrical connection of the conductive patterns 12K, 12P, 12L, and 12Q in FIG. 8 in detail. Two conductive patterns 12K and 12P are provided on the same layer A, and two conductive patterns 12L and 12Q are provided on the same layer B. According to the prior art, in the through-hole 24, there was only one conductive pattern 12 for each layer, whereas according to the embodiment of the present invention a plurality of conductive patterns may be extended to a single through-hole 24 for each layer. These conductive patterns are electrically insulated, and can be individually connected by a plurality of connection patterns on the connection pin body 22.

Within only two layers A and B in FIG. 9, two paths 12K-12L and 12P–12Q of conductive patterns are achieved. While eight to ten layers are conventionally required in the multilayer interconnection board for obtaining high-density packaging, the same density of connections can be realized by four to six layers according to the present invention, thereby reducing the problem of manufacturing precision.

2. Second Embodiment

Figure 10:
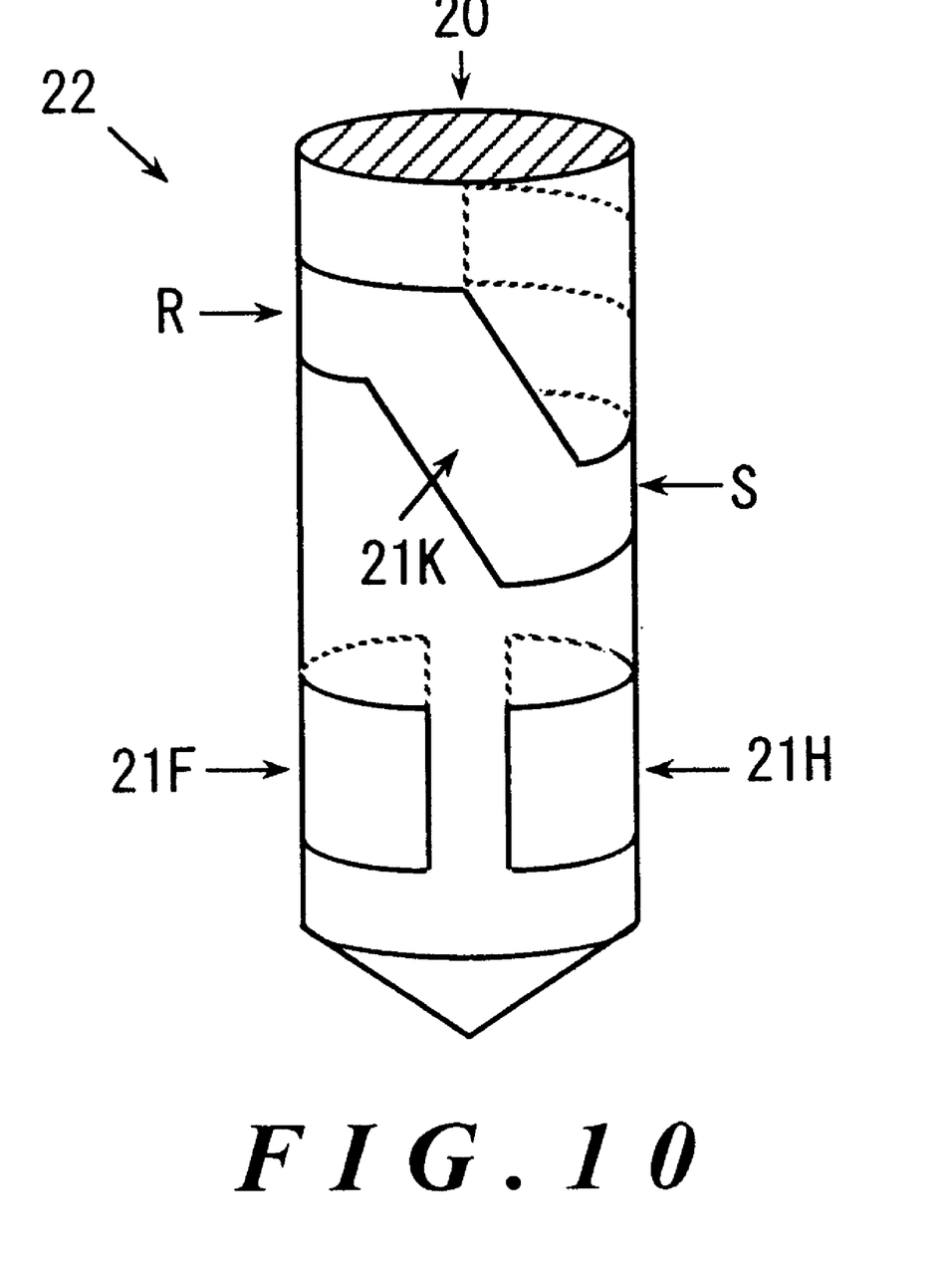
FIG. 10 shows a connection pin body 22 of the second embodiment of the present invention.

FIG. 10 shows an alternative construction for a connection pin body 22. In the embodiment of FIG. 10, at least one of the connection patterns 21K on the stem 20 is not a simple square but is extended in both the circumferential and axial directions by the necessary amounts in order to connect two conductive patterns 12 provided at different circumferential positions on different insulation layers.

The connection pattern 21K of the connection pin body 22 includes a plurality of circumferential areas R and S, the positions of which are different in the circumferential and axial directions of the connection pin body 22. When the connection pin body 22 is inserted into the through-hole 24 of the multilayer interconnection board 23, two conductive patterns 12, the positions of which are different in the circumferential and axial directions of the through hole 24, are brought into contact with the areas R and S, respectively, and are electrically connected by means of the single connection pattern 21K.

With the connection pattern 21K, the conductive patterns to be connected do not have to be located at the same circumferential position. Connections between more variable conductive patterns can be realized by extending the connection pattern 21K in the circumferential and axial directions by the necessary amounts in accordance with the arrangement of the conductive patterns.

As described above, by extending a plurality of the conductive patterns to the same through-hole in each layer of the multilayer interconnection board, and inserting a connection pin 76 in which connection patterns 21 are provided for connecting the conductive patterns 12, electrical paths between conductive patterns can readily be made along a desired route. Moreover, since a plurality of conductive patterns 12 are exposed on the through-hole 24 for each layer, high-density packaging can be realized with the use of fewer layers of the multilayer interconnection board.

What is claimed is:

1. An interconnection board for interconnecting communication lines, comprising:
   a plurality of insulation layers having a through-hole running therethrough, said insulation layers being substantially non-conductive;
   a plurality of conductive patterns provided on each of said respective insulation layers, said plurality of conductive patterns being electrically insulated from each other, and being exposed on an inside of said through-hole at substantially a same axial position of said through hole;
   a connection pin insertable in said through-hole, said connection pin having a non-conductive stem and a plurality of connection patterns provided on said non-conductive stem, wherein each of said connection patterns electrically connects two of said conductive patterns provided on different insulation layers;
   wherein said two of said conductive patterns are provided at different circumferential positions in said through-hole and one of said connection patterns extends in both axial and circumferential directions of said through-hole for connecting said two conductive patterns.

2. An interconnection board as claimed in claim 1, wherein each of said plurality of conductive patterns has substantially a same width at said through-hole.

3. An interconnection board as claimed in claim 1, wherein a circumferential interval between any pair of said plurality of conductive patterns is substantially the same at said through-hole.

4. An interconnection board as claimed in claim 1, wherein said conductive patterns on two of said insulation layers have substantially same circumferential positions at said through-hole.

5. An interconnection board as claimed in claim 1, further comprising a further connection pin insertable in said through-hole, said further connection pin having a non-conductive stem and a connection pattern provided on said non-conductive stem for electrically connecting at least two of said conductive patterns exposed on said inside of said through-hole.

6. A connection pin for electrically interconnecting conductive patterns, comprising:
   a non-conductive stem;
   a plurality of connection patterns provided on said non-conductive stem at axially-same, and circumferentially-different positions of said connection pin, whereby said connection patterns connect two of said conductive patterns and are electrically insulated from each other; and
   a plurality of further connection patterns provided on said non-conductive stem at each of two different axial positions of said connection pin, wherein
   said connection patterns at said two different axial positions are provided at substantially a same circumferential positions.

7. An interconnection board as claimed in claim 6, wherein a circumferential pitch between any pair of said plurality of conductive patterns is substantially the same at said through-hole.

8. A connection pin as claimed in claim 6, wherein each of said plurality of connection patterns provided at said same axial position of said connection pin has substantially a same circumferential width.

9. A connection pin as claimed in claim 6, wherein a circumferential pitch between any pair of said plurality of connection patterns provided at said same axial position of said connection pin is substantially constant.

10. A connection pin as claimed in claim 6, wherein a circumferential interval between any pair of said plurality of connection patterns provided at said same axial position of said connection pin is substantially the same.

11. A connection pin as claimed in claim 6, wherein each of said connection patterns connects said conductive patterns by bringing two of said conductive patterns into contact at positions which are axially different and circumferentially the same.

12. A connection pin for electrically interconnecting conductive patterns, comprising:
    a non-conductive stem;
    a plurality of connection patterns provided on said non-conductive stem at substantially a same axial position of said connection pin, whereby said connection patterns connect two of said conductive patterns and are electrically insulated from each other; and
    a pair of protrusions opposed to each other, each protruding in a radial direction of said pin.

13. A connection pin as claimed in claim 12, further comprising:
    a pinhead having upper and lower portions;
    a first pair of said protrusions opposed to each other and connected to said upper portion; and
    a second pair of said protrusions opposed to each other, provided in a same circumferential orientation as said first pair and connection said lower portion.

14. A connection pin as claimed in claim 13, wherein each of said protrusions has a v-shape including an edge aligned in an axial direction of said connection pin.

15. A main distribution frame for connecting a user line to a desired service node, comprising:
    a matrix board having multiple through-holes, a user side connected to said user line and a service-node side connected to said service node;
    a connection pin and a robot arm, said connection pin and robot arm having cooperative means whereby said robot arm can grasp said connection pin, wherein said connection pin has a protrusion, which protrudes in a radial direction of said connection pin; said robot has an arm, which has a cavity corresponding to said protrusion of said pin; and said cooperative means includes said protrusion of said connection pin and said cavity of said arm; and
    a robot control unit, which controls said robot to grasp said pin with said arm and to insert said pin in one of said through-holes in a desired orientation for connecting said user side to said service-node side along a desired route, wherein:
        said connection pin further has a pair of said protrusions opposed to each other, and
        said robot has a pair of said arms opposed to each other, each of said arms having said cavity corresponding to said protrusion for grasping said pin in a desirable orientation.

16. A main distribution frame as claimed in claim 15, wherein:
    said connection pin further comprises
    a pinhead having upper and lower portions,
    a first pair of said protrusions opposed to each other and connected to said upper portion, and
    a second pair of said protrusions opposed to each other, provided in a same circumferential orientation as said first pair and connected to said lower portion; and each of said arms has first and second cavities to be aligned with an axial direction of said pin, corresponding to one protrusion of said first pair and one protrusion of said second pair, respectively.

17. A main distribution frame as claimed in claim 16, wherein:

each of said protrusions has a v-shape including an edge aligned in an axial direction of said pin; and each of said arms has a v-shaped cavity corresponding to said v-shape of said pin.

18. A main distribution frame as claimed in claim 15, wherein:

said matrix board unit has a plurality of multilayer interconnection boards, each comprising an insulation layer having said through-holes running therethrough, and a plurality of conductive patterns provided on said insulation layer, at least two of said conductive patterns being exposed on an inside of one of said through-holes at substantially a same axial position of said through-hole, and being electrically insulated from each other, and said connection pin connects a pair of said conductive patterns exposed on said inside of said through-hole.

19. A main distribution frame as claimed in claim 18, wherein said multilayer interconnection board further comprises:

a plurality of said insulation layers, each having said plurality of conductive patterns thereon.

20. A main distribution frame as claimed in claim 19, wherein each of said plurality of conductive patterns has substantially a same width at said through-hole.

21. A main distribution frame as claimed in claim 19, wherein said plurality of conductive patterns has substantially a constant pitch therebetween at said through-hole.

22. A main distribution frame as claimed in claim 19, wherein said plurality of conductive patterns has substantially a same interval therebetween at said through-hole.

23. A main distribution frame as claimed in claim 19, wherein said conductive patterns are provided on at least two of said insulation layers at substantially same circumferential positions at said through-hole.

24. A main distribution frame as claimed in claim 15, wherein said connection pin is inserted in said through-hole, said connection pin having a connection pattern for electrically connecting two of said conductive patterns exposed on an inside of said through-hole.

25. A main distribution frame as claimed in claim 24, wherein said connection pin further has a non-conductive stem and a plurality of said connection patterns provided on said non-conductive stem.

26. A main distribution frame as claimed in claim 25, wherein at least two of said connection patterns electrically connect different pairs of said conductive patterns.

27. A main distribution frame as claimed in claim 26, wherein one conductive pattern of each of said pairs is provided at a first axial position of said through-hole, and another conductive pattern of each of said pairs is provided at a different axial position of said through-hole.

\* \* \* \* \*